United States Patent [19]

Masui

[11] Patent Number: 5,350,640
[45] Date of Patent: Sep. 27, 1994

[54] DETACHABLE BATTERY PACKAGE WITH BUILT-IN INTEGRATING POWER METER

[75] Inventor: Keiji Masui, Tokyo, Japan

[73] Assignee: NEC Corporation, Japan

[21] Appl. No.: 882,829

[22] Filed: May 14, 1992

[30] Foreign Application Priority Data

Jun. 7, 1991 [JP] Japan .................. 3-136413

[51] Int. Cl.$^5$ ........................... H01M 10/48
[52] U.S. Cl. ........................ 429/7; 429/92; 429/61
[58] Field of Search .............. 429/7, 92, 61

[56] References Cited

U.S. PATENT DOCUMENTS 4,910,103  3/1990  Yoshikawa et al. .............. 429/61
5,057,383 10/1991  Sokiva ........................... 429/92
5,256,500 10/1993  Ishimoto ......................... 429/92

*Primary Examiner*—David B. Springer
*Attorney, Agent, or Firm*—Laff, Whitesel, Conte & Saret

[57] ABSTRACT

A detachable battery package is used for a portable apparatus, and comprises a secondary nickel-cadmium battery housed in a case for supplying electric power to the portable apparatus, and a volatile memory circuit storing an integrated value indicative of electric power consumption used in the portable apparatus so that an integrating electric power meter exactly indicates residual electric power of the secondary nickel-cadmium battery.

6 Claims, 2 Drawing Sheets

DETACHABLE BATTERY PACKAGE WITH BUILT-IN INTEGRATING POWER METER

FIELD OF THE INVENTION

This invention relates to a battery package and, more particularly, to a built-in integrating power meter for monitoring residual electric power of the battery unit.

DESCRIPTION OF THE RELATED ART

One of the tendencies of electronic systems is downsizing, and various portable electronic systems such as, for example, a portable computer and a portable typewriter are available in the market. A built-in electric power unit is indispensable for the portable electronic systems, and detachable battery packages are convenient. A nickel-cadmium secondary battery is rechargeable, and is frequently used in the detachable battery package. However, if most of the electric power is discharged from the secondary battery, the portable electronic system is suddenly put out of commission due to shortage of the electric power, and the operator would appreciate an early warning. For this reason, a prior art portable electronic system is usually equipped with a voltmeter or an integrating power meter indicative of residual electric power of the secondary battery.

However, if the nickel-cadmium battery is used in the prior art portable electronic system equipped with the voltmeter, the voltmeter is less useful, because the nickel-cadmium battery is fairly constant in electromotive force throughout the service life. In other words, the voltmeter merely warns an operator of exhausted state of the nickel-cadmium secondary battery.

On the other hand, an integrating electric power meter can warn an operator of the shortage of electric power weal before the exhausted state, and is popular for with the prior art portable electronic systems. The integrating power meter incorporated in the prior art portable electronic system has a volatile memory circuit, and the volatile memory circuit stores electric power consumption or an integrated value calculated from the current flowing out from the battery and operating time interval. When the nickel-cadmium secondary battery is fully recharged, the integrated value is set to zero, and is incremented with operating time. The difference between the capacity of the battery and the integrated value is indicative of the residual electric power of the nickel-cadmium secondary battery. However, a problem is encountered in the prior art portable electronic system equipped with the integrating electric power meter in that the volatile memory circuit loses the integrated value when the secondary battery is detached therefrom. Moreover, while the prior art portable electronic system is under operation, replacement with a new fully charged battery makes the integrated value stored in the volatile memory circuit invalid.

SUMMARY OF THE INVENTION

It is therefore an important object of the present invention to provide a detachable battery package which is free from the problems inherent in the prior arts.

To accomplish these objects, the present invention proposes to supply electric power from a build-in battery of a detachable battery package to a volatile memory circuit also incorporated in the detachable battery package.

In accordance with one aspect of the present invention, there is provided a detachable battery package used in an apparatus for supplying electric power, comprising: a) a case having a hollow space; b) a battery unit housed in the case; and c) an electric circuit having a volatile memory circuit housed in the case, and supplied with electric power from the battery unit for storing an integrated value indicative of electric power consumption mainly used in the portable apparatus.

In accordance with another aspect of the present invention, there is provided a portable system comprising a) a portable apparatus equipped with an electric circuit for achieving a predetermined function, and b) a battery package detachable from the portable apparatus, and supplying electric power to the electric circuit, the battery package comprising b-1) a case having a hollow space, b-2) a battery unit housed in the case, and b-3) an electric circuit with a volatile memory circuit housed in the case, and supplied with electric power from the battery unit for storing integrated value indicative of electric power consumption mainly used in the portable apparatus.

BRIEF DESCRIPTION OF THE DRAWINGS

The features and advantages of the detachable battery package according to the present invention will be more clearly understood from the following description taken in conjunction with the accompanying drawings in which.

DESCRIPTION OF THE PREFERRED EMBODIMENTS

First Embodiment

Figure 1:
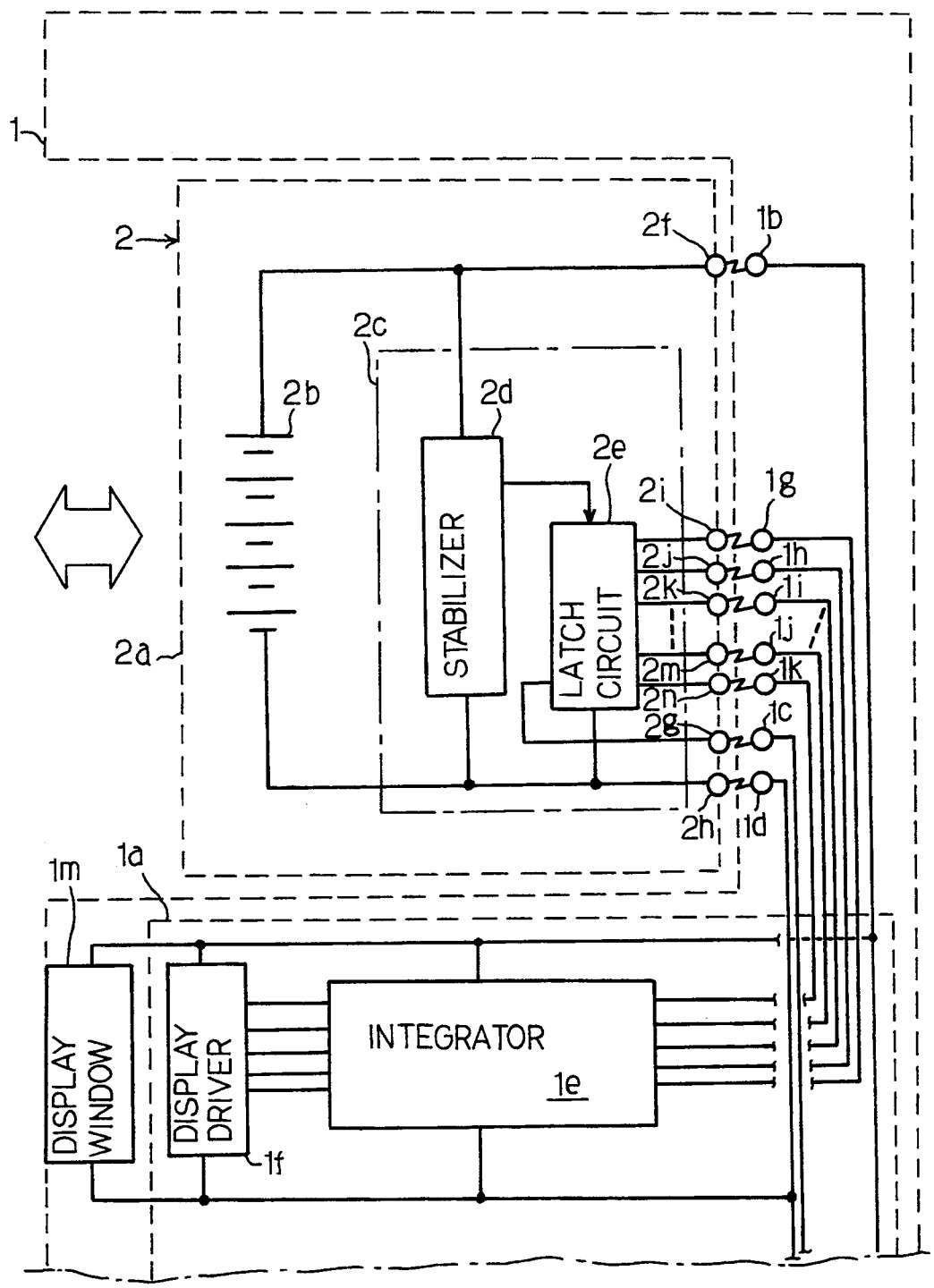
FIG. 1 is a block diagram showing the arrangement of a portable system according to the present invention.

Referring first to FIG. 1 of the drawings, a portable system embodying the present invention largely comprises an apparatus 1 and a battery package unit 2 detachable from the apparatus. The portable system may be a portable computer, a portable typewriter, a portable word-processor, a portable recording and/or reproducing system, a portable video camera and so forth. The portable apparatus 1 is equipped with an electric circuit board 1a coupled with three terminals 1b, 1c and 1d, and the terminal 1c serves as a clock signal terminal for supplying a system clock signal to the battery package unit 2. The terminal 1b is applied with the positive power voltage level, and the terminal 1d supplies a ground voltage level. On the electric circuit board 1a are mounted an electric power integrator 1e and a display driver 1f the former of which calculates an integrated value indicative of electric power consumption consumed by the portable apparatus 1 on the basis of current and time interval. The electric power integrator 1e produces a multi-bit data signal indicative of the integrated value, and the multi-bit data signal is supplied to data terminals 1h, 1i, 1j and 1k. The electric power integrator 1e further supplies a multi-bit image signal to the display driver 1f. The display diver 1f is responsive to the multi-bit image signal, and drives a display window 1m so as to produce visual images indicative of residual electric power accumulated in the detachable battery package unit 2.

The detachable battery package unit 2 comprises a case 2a having a hollow space inside thereof, a nickel-cadmium battery 2b and an electric circuit 2c. The nickel-cadmium battery 2b and the electric circuit 2c are housed in the case 2a, and, accordingly, are protected from physical and electric damages. The nickel-cadmium battery 2b is of the secondary type, and, therefore, is rechargeable. The electric circuit 2c comprises an electric power stabilizer 2d coupled with the nickel-cadmium battery 2b, and a parallel-in/parallel-out latching circuit 2e supplied with electric power from the electric power stabilizer 2d. The electric power stabilizer 2d produces a step-down voltage level, and the step-down power voltage level is supplied to the parallel-in/parallel-out latching circuit 2e. A plurality of terminals 2f, 2g, 2h, 2i, 2j, 2k, 2m and 2n are provided on the case 2a, and the terminals 2f to 2h are associated with the terminals 1b, 1c and 1d, and the terminals 2i to 2n are assigned to the multi-bit data signals. Namely, the terminals 2f and 2h are coupled with the output nodes of the electric power stabilizer 2d, and relays the positive power voltage to the terminals 1b. The system clock signal is transferred from the terminal 1c through the terminal 1c to the parallel-in/ parallel-out latching circuit 2e, and the terminal 1d distributes the ground voltage level. The remaining terminals 2j to 2n respectively correspond to the data terminals 1g to 1k of the portable apparatus 1, and are coupled with the latching circuit 2e.

When the battery package 2 is attached to the portable apparatus 1, the terminals 2f to 2n are electrically coupled with the corresponding terminals 1b to 1k. The nickel-cadmium battery 2b supplies positive power voltage level to the portable apparatus 1, and the electric stabilizer 2d supplies the step-down voltage level to the parallel-in/parallel-out latching circuit 2e. The latching circuit 2e is responsive to the system clock signal supplied from the terminal 2g and communicable with the electric power integrator 1e for the multi-bit data signal.

Assuming now that a new detachable battery package 2 is attached to the portable apparatus 1, the latching circuit 2e stores the integrated value of zero, and the electric power integrator 1e fetches the integrated value stored in the latching circuit 2e, and increments the integrated value while the portable apparatus 1 is activated. The electric power integrator 1e periodically supplies the multi-bit data signal indicative of the integrated value through the terminals 1g to 1k and 2i to 2n to the latching circuit 2e, and the integrated value stored in the latching circuit 2e is periodically incremented. The multi-bit image signal is further supplied to the display driver 1f, and the display driver 1f causes the display window 1m to reproduce the visual images indicative of the remaining electric power. The remaining electric power is tantamount to the difference between the capacity of the nickel-cadmium battery 2b and the electric power consumption indicated by the multi-bit data signal.

If the portable apparatus is deactivated, the electric power is not consumed by the portable apparatus, and the latching circuit 2e maintains the latest integrated value, because the electric power continuously is supplied from the nickel-cadmium battery 2b.

If the battery package unit 2 is detached from the portable apparatus 1, and the nickel-cadmium battery 2b is taken out from the case 2a for recharging. No electric power is supplied to the latching circuit 2e, and the latching circuit 2e is set to zero. The battery package unit 2 is attached to the portable apparatus 1, and the electric power integrator 1e increments the integrated value stored in the volatile memory or latching circuit 2e from zero again while the portable apparatus 1 is activated.

Thus, the integrated value stored in the volatile memory or latching circuit 2e is always changing to be indicative of the electric power which has been supplied from the nickel-cadmium battery 2b, and is adjustable to zero upon recharge of the nickel-cadmium battery 2b. Therefore, the display window 1m warns an operator of shortage of electric power well before the empty, and replacement with a new detachable battery package does not disturb the indication on the display window. The battery 2b is usually recharged before reaching empty. Even if the battery 2b is continuously used and perfectly exhausted, the latching circuit 2e may overflow. However, the battery 2b has not already been able to drive the portable apparatus 1, and the visual images on the display window have been useless.

Second Embodiment

Figure 2:
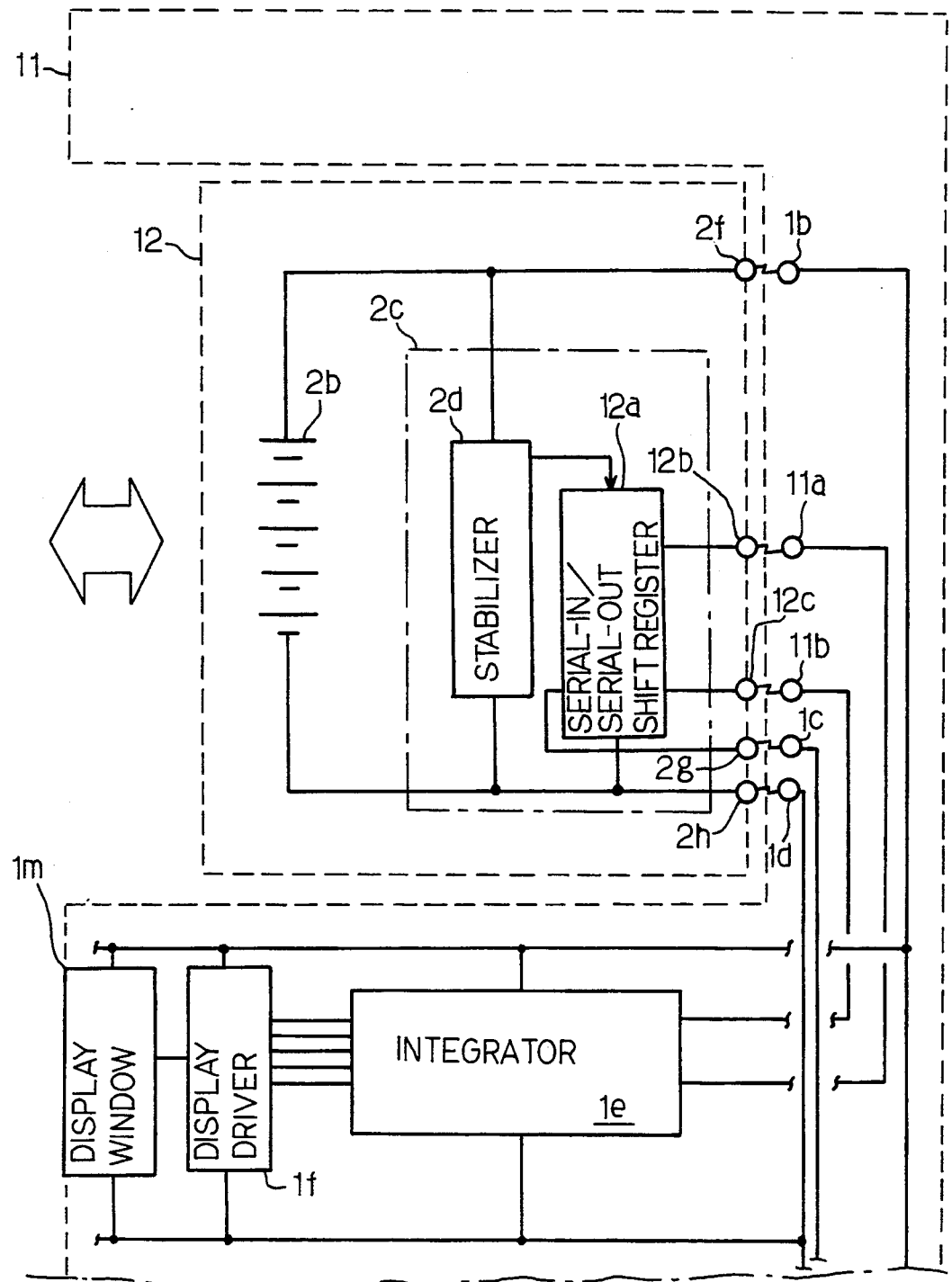
FIG. 2 is a block diagram showing the arrangement of another portable system according to the present invention.

Turning to FIG. 2 of the drawings, another portable system embodying the present invention largely comprises a portable apparatus 11 and a detachable battery package unit 12. The portable apparatus 11 is similar to the portable apparatus 1 except for the number of data terminals 11a, and the other components are labeled with the same references designating the corresponding components of the portable apparatus 1 without detailed description. The detachable battery package unit 12 is also similar to the detachable battery package 2 except for the volatile memory circuit, and the same references used in FIG. 1 designates the corresponding components for avoiding repetition. The volatile memory circuit incorporated in the second embodiment is implemented by a serial-in/ serial-out shift register 12a, and only two data terminals, i.e., an input data terminal 12b and an output data terminal 12c are provided for the shift register 12a.

The serial-in/serial-out type shift register 12a is attractive in view of communication terminals, and makes the arrangement of the portable system simple. However, the function and the advantages of the second embodiment are similar to those of the first embodiment, and no further description is incorporated hereinbelow for the sake of simplicity.

Although particular embodiments of the present invention have been shown and described, it will be obvious to those skilled in the art that various changes and modifications may be made without departing from the spirit and scope of the present invention. For example, the detachable battery unit may supply electric power to a large apparatus usually installed on a desk, a floor and so forth, and the detachable battery unit may serve as a backup electric power unit. Moreover, the secondary nickel-cadmium batteries are used in the embodiments. However, any type of battery is available for the detachable battery package.

What is claimed is:

1. A battery package used in an apparatus for supplying electric power, said battery package unit being detachable from said apparatus, said package comprising:
 a) a case having a hollow space;
 b) a battery unit housed in said case; and
 c) an electric circuit having a volatile memory circuit housed in said case, and supplied with electric power from said battery unit, said memory circuit storing information relative to electric power consumption of said portable apparatus and said electric circuit.

2. A battery package as set forth in claim 1, in which said battery unit is rechargeable.

3. A battery package as set forth in claim 2, in which said battery unit is a nickel-cadmium battery.

4. A battery package as set forth in claim 1, in which said battery unit is associated with an electric power stabilizer forming a part of said electric circuit.

5. A battery package as set forth in claim 1, in which said volatile memory circuit is a parallel-in/parallel-out latching circuit which is communicable with said apparatus through a plurality of data terminals.

6. A battery package as set forth in claim 1, in which said volatile memory circuit is a serial-in/serial-out shift register which is communicable with said apparatus through an input data terminal and an output data terminal.

* * * * *